United States Patent
Foutz et al.

(10) Patent No.: US 6,581,197 B1
(45) Date of Patent: Jun. 17, 2003

(54) MINIMAL LEVEL SENSITIVE TIMING REPRESENTATIVE OF A CIRCUIT PATH

(75) Inventors: Brian Foutz, Ithaca, NY (US); Martin Foltin, Fort Collins, CO (US); Sean Tyler, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 28 days.

(21) Appl. No.: 09/927,856

(22) Filed: Aug. 10, 2001

(51) Int. Cl.⁷ .............................................. G06F 17/50
(52) U.S. Cl. ............................................ 716/6; 716/18
(58) Field of Search ....................... 716/1–6, 18; 703/19

(56) References Cited

U.S. PATENT DOCUMENTS

| | | | | |
|---|---|---|---|---|
| 4,924,430 A | * | 5/1990 | Zasio et al. ..................... 716/6 |
| 5,475,607 A | * | 12/1995 | Apte et al. ..................... 716/10 |
| 5,651,012 A | * | 7/1997 | Jones, Jr. ..................... 714/724 |
| 5,740,347 A | * | 4/1998 | Avidan ..................... 714/33 |
| 5,812,561 A | * | 9/1998 | Giles et al. ..................... 714/726 |
| 6,023,568 A | * | 2/2000 | Segal ..................... 716/6 |
| 6,173,435 B1 | * | 1/2001 | Dupenloup ..................... 716/18 |
| 6,209,122 B1 | | 3/2001 | Jyu et al. ..................... 716/6 |
| 6,430,731 B1 | * | 8/2002 | Lee et al. ..................... 716/6 |

* cited by examiner

Primary Examiner—Matthew Smith
Assistant Examiner—Paul Dinh

(57) ABSTRACT

A minimal level sensitive timing representative of a circuit path uses a circuit path timing model to represent a circuit block, which contains multiple circuit paths, in a simplified form, thus reducing the circuit paths to a minimized representation with same timing requirements and fixed clock waveforms. The reduction of the circuit paths in turn results in significant speed-up of static timing analysis (STA) runs on large circuits and reduced memory and storage space requirements. The minimal level sensitive timing representative may simplifies the output from the timing analysis and shortens designer's time to analyze STA results.

20 Claims, 4 Drawing Sheets

MINIMAL LEVEL SENSITIVE TIMING REPRESENTATIVE OF A CIRCUIT PATH

CROSS-REFERENCE TO RELATED PATENT APPLICATIONS

This application is related to commonly assigned U.S. patent application Ser. No. 09/927,220, entitled "Modeling Circuit Environmental Sensitivity of a Minimal Level Sensitive Timing Abstraction Model;" U.S. patent application Ser. No. 09/928,161, entitled "A Minimal Level Sensitive Timing Abstraction Model Capable of Being Used in General Static Timing Analysis Tools;" U.S. patent application Ser. No. 09/927,857, entitled "Improved Load Sensitivity Modeling in a Minimal Level Sensitive Timing Abstraction Model;" and U.S. patent application Ser. No. 09/927,204, entitled "Enabling Verification of a Minimal Level Sensitive Timing Abstraction Model."

TECHNICAL FIELD

The technical field relates to timing analysis systems, and, in particular, to static timing analysis of a digital circuit.

BACKGROUND

A wide variety of design verification tools are required to produce a working integrated circuit from a functional specification. These tools analyze different parameters of a circuit design to insure that the circuit will function properly after the circuit is fabricated. One important set of verification tools includes timing analysis tools, which are widely used to predict the performance of very large scale integrated (VLSI) designs. Often, timing analysis determines the best path for a designer to pursue or helps to optimize the overall circuit design. In digital circuits, timing considerations can be critical to proper performance. Timing analysis tools may be either static or dynamic.

Dynamic timing analysis (DTA) tools provide the most detailed and accurate information obtainable concerning the performance of a circuit. With DTA, a design engineer must provide sets of waveforms to simulate the conditions under which a circuit will operate. This type of timing analysis is often generated through simulation of a circuit by simulation programs that operate at the transistor level. Examples of such circuit simulation programs are SPICE by University of California at Berkeley and ASTAP by IBM Corporation. For more information on SPICE, refer to "SPICE2: A Computer Program to Simulate Semiconductor Circuits," by L. W. Nagel, Technical Report ERL-M520, UC-Berkeley, May 1975. These DTA programs typically operate by solving matrix equations relating to the circuit parameters, such as voltages, currents, resistances and capacitances. Additionally, such circuit simulation approaches to performance analysis are pattern dependent, or stated another way, the possible paths and the delays associated with the paths depend upon a state of a controlling mechanism or machine of the circuit being simulated. Thus, the result of a DTA depends on the particular test pattern, or vector, applied to the circuit.

While such circuit simulation programs and DTA tools provide high accuracy, long simulation times are required because a large number of patterns must be simulated since the best and worst case patterns are not known before the simulation occurs. The number of simulations which must be performed is proportional to $2^n$, where "n" is a number of inputs to the circuit being simulated. Thus, for circuits having a large number of inputs, DTA is not always practical.

Static timing analysis (STA) tools are also widely used to predict the performance of VLSI designs. In STA, a design engineer applies signal arrival and departure times only at each block input, not at base waveform. Additionally, each signal is assumed to switch independently in each machine cycle, i.e., static timing analyzer is waveform independent and simulates the most critical arrival time at each node in the circuit.

In STA, since only the best and worst possible rising and falling times are computed for each signal in the circuit, such times are typically determined in a single pass through a topologically-sorted circuit. When referring to a topologically-sorted circuit, a signal time associated with each subcircuit of the circuit being tested is determined in a sequential nature. Therefore, the signal time associated with a first subcircuit whose output will be propagated to a second subcircuit must be determined before the signal time associated with the second subcircuit is calculated. Typical static analysis methods are described in "Timing Analysis of Computer Hardware," by Robert B. Hitchcock, Sr., et al., IBM J. Res. Develop., Vol. 26, No. 1, pp. 100–105 (1982).

Timing models used in timing analysis are blocks of computer data that can be used to recreate the timing behavior of an electronic circuit. The size of timing models should be as small as possible for a given complexity of circuit, while maintaining the accuracy of the timing model. In general, a smaller timing model will not only require less space in a computer memory, but also will be faster for a computer to evaluate. Often, timing model accuracy is sacrificed to shrink the timing model and speed its evaluation. This is especially important for large timing models that represent an entire subcircuit of an electronic system.

A popular technique for shrinking a timing model involves creating port-based timing models as opposed to path-based timing models. Port-based timing models analyze an electronic circuit to isolate and maintain only the timing behavior that can be observed at the circuit's connections, often referred to as ports, to surrounding circuits. Any timing behavior of a circuit that is internal to the circuit is discarded, leaving only the information that is essential to verifying the timing behavior of the circuit in the context of surrounding circuits. The port-based timing models have been used in both timing simulation and STA. The timing models are accurate, and generally provide good compression of timing model size.

In port-based timing modeling, the electronic circuit is analyzed to determine the longest time for an electronic signal to pass from each input port to each output port. Often the shortest time is determined as well. An edge triggered latch in the circuit, controlled by a clock signal, acts much like an internal port and is also considered a start point and an end point for electronic signals. At the instant the value of its clock signal changes, the edge triggered latch passes the value of its data signal to its output signal. At other times, the edge triggered latch holds the value of its output signal constant. Analysis is also done to determine the longest time for an electronic signal to pass from each input port to the input signals of each edge triggered latch and from the output signal of each edge triggered latch to each output port.

In true port-based timing models, the internal latch nodes are abstracted away and only the longest time for an electronic signal to arrive at each given output port is calculated. Often the shortest time is calculated as well. The latest (and often also the earliest) allowed time for signal to arrive at each given input port is also calculated. For circuits with edge triggered latches, these calculations are rather simple. The longest time for a signal to arrive at the output port is the time when the clock signal changes on the edge triggered latch that is connected to the output port by a combinational circuitry, plus the time the signal passes from the latch to the output port. If more edge triggered latches are connected to the output port by a combinational circuitry, the latest signal arrival from all the latches is considered. The latest allowed time for the signal to arrive at the input port is the time when the clock signal changes on the edge triggered latch that is connected to the input port by a combinational circuitry, minus the time the signal passes from the input port to the latch, minus the setup time for the latch (due to the physical characteristics of the latch electronic circuitry, the signal value at the latch input must be stable before the clock signal changes). If more latches are connected to the input port by a combinational circuitry, the latest time for the signal to arrive at the input port is the minimum from the latest times determined for the individual latches as described above. The latch that determines the minimum time is referred to as the most critical latch. PathMill's Black box timing model supports these calculations. However, the calculations become more complicated for circuits that use level triggered latches, and PathMill's Black box cannot accurately model such circuits.

Many digital circuits use level triggered latches, i.e., transparent latches, in place of edge triggered latches. Like an edge triggered latch, a level triggered latch is controlled by a clock signal. The edge triggered latches are active only at the instant the clock signal changes, while the level triggered latches can be active at any time that the clock signal remains at a specified voltage (high or low voltage).

The level triggered latches in a circuit can time borrow amongst themselves. Time borrowing is possible when the combinational logic between two latches requires more time than the clock phase to compute a stable value. However, if the logic following the second latch requires less than an entire clock phase to compute a stable value, then the value propagated by the first latch need not become stable until some time after the second latch becomes active. The second set of logic will still have enough time to propagate a stable value, even though the calculations did not begin until some time after the latches become active. Time borrowing is an essential technique for latch-based design. High performance or custom designed circuits, such as modern CPUs, rely on level triggered latches to take advantage of the time borrowing that helps reach high clock frequencies. Timing models that do not support time borrowing are inadequate for such designs.

When the clock signal transitions to inactivate the latch, the level triggered latch latches the input data and holds that value on the output port until the clock transitions again. The input data is fed to the level triggered latch via the latch's data pin. The output of the latch is available on the latch's output pin. The clock signal is connected to the latch using the latch's clock pin.

Due to the physical characteristics of the electronic circuitry from which physical latches are implemented, the transition between when the latch is transparent and when the latch holds its value is not instantaneous. Therefore, the value on the data pin must be available a certain amount of time before the clock signal transitions to a low voltage. This time is called the setup time. Routines that verify that the data is available early enough to meet the setup time are called setup checks and violations are called setup violations. In addition to the setup time, the data value must remain constant for a certain amount of time after the clock transitions to low. This time is called the hold time. Routines that verify that the data is available long enough to meet the hold time are called hold checks and violations are called hold violations. If a setup or a hold violation occurs, the latch might not contain a valid value. Thus, it is important that timing models accurately represent setup and hold times.

In a timing model block for a circuit, a signal arriving at the output ports depends on the signal arrival time at the input ports, referred to as stimulus. In a stimulus dependent timing model, the parameters of the timing model are limited to certain intervals of the arrival times. If the stimulus is outside of the interval, the timing model does not properly represent the circuit and the model needs to be rebuilt each time when the stimulus change. In a stimulus independent timing model, the timing model works irrespective of when the signal arrives at the input ports, i.e., always generating correct arrival at the output port.

Currently available timing models that can be input into general STA tools fall into three categories. PathMill's conventional Black box timing models are port-based and stimulus independent. However, the conventional Black box timing models do not support transparency. PathMill's new transparent Black box timing models are port-based with limited support of transparency. However, the new Transparent Black box timing models are stimulus dependent. Pathmill's Gray box timing models support transparency and are stimulus independent. However, the Gray box timing models are not port-based.

For circuits with level triggered latches, the Transparent Black box timing models are significant improvement over the conventional Black box timing models. The latest allowed time for the signal to arrive at a given input port, i.e., the time before setup violation occurs, is calculated, considering not only the first latch connected to the given input port by a combinational circuitry. The second latch or other sequential element that is connected to the first latch by a combinational circuitry is also considered, as well as the third and any successive latch that may be on a transparent path from the given input port. Considering all latches is important because, in circuits with transparent latches, the second, third, or other latch on the transparent path from an input port may be more critical than the first latch, i.e., the second, third, or other latch determines the latest time on the input port before the setup violation occurs, employing similar calculation procedure as described earlier for the first latch in the conventional Black box timing model. Similarly, the longest time for an electronic signal to arrive at the output port is calculated, considering not only the last latch connected to the output port by a combinational circuitry, but also the previous latch that is connected to the last latch by a combinational circuitry, as well as any earlier latch that may be on a transparent path to the output port.

However, in the Transparent Black box timing model, the signal arrival at the output port on a transparent path is correct only for the input port stimulus that was used to build the model. When the input stimulus changes, the model needs to be rebuilt or the signal arrivals at output ports on transparent paths may be wrong, since the Black box timing model cannot represent the unique clock-controlled connectivity between the input and the output ports on a transparent path. Instead, the output signal arrival time on the most critical transparent path is hard-coded in the model, which makes the model valid only for a particular input stimulus.

PathMill's Gray box timing models support transparency and are stimulus independent. However, Gray box timing models abstract only combinational circuit elements and retain all sequential elements that are represented by internal clock-controlled nodes connected by time-arcs, i.e., not port-based. For blocks with a large number of latches, Gray box timing models have a large number of internal nodes and time-arcs, resulting in a large number of timing checks to be performed and a large number of paths to be traced in a STA run. All timing checks carried out on a lower level of hierarchy need to be repeated again on higher hierarchy levels, because no sequential nodes are abstracted away when moving from one level of hierarchy to the next level. As a result, the large number of timing checks leads to long STA runtimes and large memory requirements, especially on higher hierarchy levels and full chip levels, which, in turn, results in slow roll-up/roll-down times and a need to manually simplify the timing model so that the STA on larger blocks does not run out of memory.

SUMMARY

A method for modeling a circuit path with a minimal level sensitive timing representative includes extracting a plurality of parameters from the circuit path that includes latches controlled by clock elements and creating an echo-circuit that represents the plurality of parameters. The parameters to be extracted may include a required time parameter associated with a check node for a first failing latch on the circuit path and a valid time parameter associated with a dummy latch node for a latest output driving latch on the circuit path. The dummy latch node enables a signal to propagate from an input port to an output port only if the signal arrives at the output port later than a clock signal from a most critical clock element controlling the dummy latch node. The resulting echo-circuit maintains clock edges of a first latch at an input port and a last latch at an output port.

The minimal level sensitive timing representative of a circuit path uses a circuit path timing model to represent a circuit block, which contains multiple circuit paths, in a simplified form, thus reducing the circuit paths to a minimized representation with same timing requirements and fixed clock waveforms. The reduction of the circuit paths in turn results in significant speed-up of STA runs on large circuits and reduced memory and storage space requirements. The minimal level sensitive timing representative may also simplify the output from the timing analysis and may shorten designer's time to analyze STA results.

DESCRIPTION OF THE DRAWINGS

The preferred embodiments of a minimal level sensitive timing representative of a circuit path will be described in detail with reference to the following figures, in which like numerals refer to like elements, and wherein.

DETAILED DESCRIPTION

Figure 1:
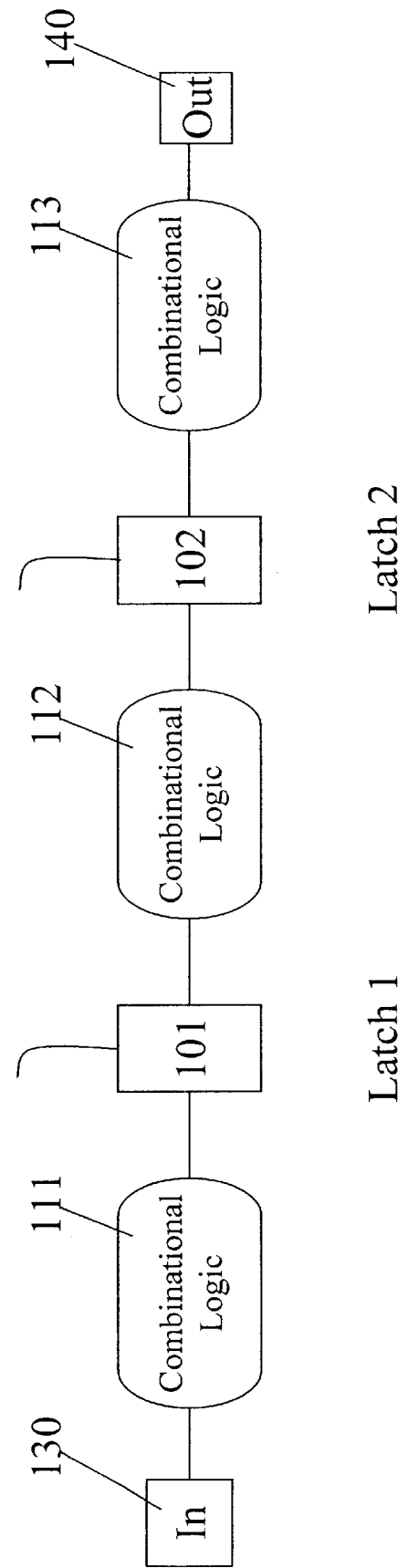
FIG. 1 illustrates an exemplary circuit path of a circuit block.

A minimal level sensitive timing representative of a circuit path uses a circuit path timing model to represent, in a simplified form, a circuit block that contains multiple circuit paths, thus reducing the circuit paths to a minimized representation with same timing requirements and fixed clock waveforms. The reduction of the circuit paths in turn results in significant speed-up of STA runs on large circuits and reduced memory and storage space requirements. The minimal level sensitive timing representative may also simplify the output from the timing analysis and may shorten designer's time to analyze STA results.

The purpose of the timing analysis is to simulate signal arrival times at different nodes in a digital circuit to assure proper functionality of the circuit. Within the circuit are clock-controlled nodes and nodes that are not controlled by clocks. On the clock-controlled nodes, the signal must arrive within a certain time interval relative to the clock. For example, for an edge triggered latch, the signal must arrive at the latch before the active edge of the clock, and for a level triggered latch, the signal must arrive before the closing edge of the clock, i.e., while the latch is open or in an active level. If the signal does not arrive within this timing interval, a violation occurs and the circuit may not function properly. Timing analysis is a computer simulation of the digital circuit to simulate arrival times on the clock-controlled nodes and to verify that the signal arrives at the nodes within the allowed time interval.

A micro chip containing digital circuits may have millions of elements, such as transistors, gates, resistors, and interconnects represented by resistors and capacitors. Simulation and timing analysis on a full chip level is expensive. Accordingly, a common practice is to divide the chip into blocks and conduct timing analysis on each of the blocks individually. The blocks are given the characteristics of the real circuit, by abstracting away unnecessary information from the circuit and characterizing the circuit by a set of useful parameters.

Port-based timing models involve less timing simulation than path-based timing models. In port-based timing models, the number of nodes scales with the number of ports. In path-based timing models, the number of nodes scales with the number of paths, which is significantly more than the number of ports in a circuit. The more nodes there are, the longer the timing checks take. So the number of nodes determines how fast the timing checks are performed. In an embodiment of the timing abstraction model, which is port-based rather than path-based, the number of timing checks to be performed, i.e., the number of parameters, scales with the number of input ports plus the number of input-to-output port pairs that are connected by transparent paths for at least one input stimulus, which is usually much less than the total number of paths in the circuit.

Accordingly, the speed-up of STA runs that uses the timing abstraction model may be achieved as follows. First, the number of timing checks to be performed in most circuits may be reduced to one check for each input port plus one check for each input-to-output port pair that is connected by a transparent path for at least one input stimulus. Second, each timing check may be performed faster in the port-based timing model than in a path-based timing model, because the number of clock controlled internal nodes in the port-based model is small, i.e., in most circuits the number of clock controlled nodes is equal to number of ports. Therefore, a larger part of this port-based model may be stored in the fast computer memory, i.e., the main memory or the very fast microprocessor cache memory, than in the path-based timing models. Third, only the most relevant transparent paths, i.e., paths on which a signal arrives at the output port later than the latest clock signal, are traced to a given output port, reducing the number of paths fed to the adjacent blocks.

Level triggered latches, which support transparency, can be active when any of their clock signals, i.e., clock elements, remain at a high voltage, while edge triggered latches are active only at the instant the clock signals change. Some level triggered latches are active when the clock signals are at low voltage, instead of high voltage, but the processes are the same. The timing abstraction model has level triggered latches. In the discussion that follows, level triggered latches are transparent when the clock signals are high, but as will be apparent to one skilled in the art, the techniques described also apply to latches that pass values when the clock signals are low. Also, the following paragraphs describe modeling of maximum (long) path STAs, i.e., the paths with the latest signal arrival at input and output ports. As will be apparent to one skilled in the art, the techniques described also apply to minimum (short) path STAs, i.e., the paths with the earliest signal arrival at the input and output ports, except that there are no short transparent paths in the circuit.

An embodiment of the timing abstraction model first extracts a minimal set of characteristics, i.e., parameters, from the modeled circuit in order to simulate timing on the circuit. The parameters include: 1) a required time parameter associated with an input port, i.e., the latest time a signal can arrive at the input port before a setup violation would occur in the modeled circuit on some sequential element, i.e., a latch or a domino logic, connected to the input port by a combinational circuitry and/or a circuitry that consists of one or more transparent sequential elements; 2) a valid time parameter associated with an output port, i.e., the latest time the signal from any clock element arrives at the output port; and 3) an input-to-output delay parameter that represents a time delay a signal passes from the input to the output port on a transparent path.

Next, the timing abstraction model creates an echo-circuit that represents the characteristics and can be input into virtually any STA tool. The echo-circuit may be a timing abstraction model represented in PathMill's Gray box format.

The first characteristic to be extracted is a setup/hold check time, referred to as a required time, associated with a setup/hold check node at each input port in the timing abstraction model. Associating timing checks with the input port do not reduce the universality of the timing abstraction model because STA analysis tools support circuits with setup/hold timing checks attached to any node.

STA uses two different simulations. A simulation for maximum paths, i.e., the setup check, determines the latest time a data signal can arrive at the input port before any violation in the modeled circuit will occur. A simulation for minimal paths, i.e., the hold check, determines if the data signal is stable for a long enough time at the input port. The following paragraphs describe the simulation with respect to the maximum path. However, one skilled in the art should appreciate that the minimal path simulation behaves in a similar fashion, except that there are no transparencies in minimal path simulation because there is no input-to-output path.

As described above, the setup check node checks data arrival at the input port with respect to the required time, which is the latest time the data signal can arrive at the input port before any violation would occur in the modeled circuit. In other words, the setup check node checks if the data signal arrives at the input port early enough so that the most critical clock-controlled node of the modeled circuit, i.e., the most critical latch or other sequential element such as the domino logic, will have no violation. The most critical sequential element in the modeled circuit is the sequential element on which the violation occurs with the earliest time arrival at the input port. The most critical path is the one that fails first, and the setup check node checks the required time that corresponds to the time when the failure occurs on the most critical sequential element.

As an example, a circuit with three latches may have the most critical as the second latch. In this example, 800 picoseconds may be required for a signal to propagate from the input port to the second latch, and the signal may be required to be at the second latch at time 1000 picoseconds or earlier. If the signal arrives at the second latch in the modeled circuit at 1000 picoseconds, which is the latest allowed time, there is no violation. On the other hand, if the signal arrives at 1001 picoseconds, a violation occurs. Since 800 picoseconds are required to propagate the signal from the input port to the second latch, the signal must arrive at the input port within 200 picoseconds.

In general, the setup time, SI, at an input port I can be expressed as:

$$SI = \min_j(SI_j) \quad (1)$$

$$SI_j = SL_j + (Cycle_j - Cycle_0)T - Delay_j, \quad (2)$$

where $SI_j$ is the latest time a signal can arrive at the input port I before violation would occur on a sequential element, i.e., latch or domino logic, $L_j$ in the modeled circuit, $SL_j$ is the latest time signal can arrive at the sequential element $L_j$ before setup violation would occur on the sequential element, $Cycle_j$ is the clock cycle count on the sequential element $L_j$, $Cycle_0$ is the cycle count on input I (usually $Cycle_0 = 1$), T is the clock cycle time (the clock period) and $Delay_j$ is the time the signal needs to propagate from the input port I to the sequential element $L_j$.

The setup times $SI_j$ can be obtained, for example, from a Pathmill run with a late stimulus at the input port I and a latch_error_recovery feature turned on. The late stimulus is an arbitrarily chosen stimulus, Lstim, that is so late that with a certainty a setup violation will occur on some sequential element in the circuit (usually, Lstim can be any number that is much higher than the clock period T). Then, the setup time $SI_j$ can be expressed as:

$$SI_j = Lstim - \sum_{k=1}^{j-1} Advance_k + Slack_j, \quad (3)$$

where $Slack_j$ is the timing slack on the sequential element $L_j$, and $Advance_k$ is the timing adjustment introduced by the latch_error_recovery feature on the sequential element $L_k$ that is on the path from the input port I to the sequential element $L_j$.

The setup times, $SI_j$, can be obtained from other commercial STA tools in a similar way. For example, the setup times can also be obtained directly from Pathmill's Transparent Black model, if the signal arrival times at output ports are not subjected to any constraints when such model is generated.

The second characteristic to be extracted is an opening time, referred to as a valid time, associated with a dummy latch node attached to each output port. The dummy latch node may be controlled by a derived clock that has an opening edge offset with respect to the opening edge of a clock port. The derived clock typically becomes active at the time corresponding to the latest signal arrival from the clock port to the output port in the modeled circuit. The dummy latch node compares data signal arrival at the output port with the clock signal arrival of the latest clock at the output port. All paths arriving before the latest clock stop at the dummy latch node, i.e., the paths are not transparent and the clock signal goes to the output port instead. If the data signal arrives after the clock signal, the data signal propagates to the output port.

Multiple paths may converge from multiple input ports to one output port, with each path controlled by a different clock. In the timing abstraction model, the dummy latch node enables comparison of the data signal with the latest clock signal. Accordingly, the data signal may be blocked if the signal arrives earlier than any of the clocks converging to the output port. Comparing the paths with the most critical clock significantly reduces the number of paths that arrive at the output port.

In general, the valid time, VO, at an output port O can be expressed as:

$$VO = \max_j(VO_j) \quad (4)$$

$$VO_j = DO_j - (Cycle_j - 1)T \quad (5)$$

$$DO_j = DC_j + Delay_j, \quad (6)$$

where $DO_j$ is the signal arrival time at the output port O from clock port $C_j$, $DC_j$ is the signal arrival at a clock port $C_j$, $Delay_j$ is the time the signal needs to propagate from the clock port $C_j$ to the output port O, $VO_j$ is the time $DO_j$ adjusted to the first clock cycle, $Cycle_j$ is the clock cycle count on the output port O and T is the clock cycle time (the clock period). Note that the valid time VO calculated from equations (4)–(6) is adjusted to be in the first clock cycle. The offset between the clock port $C_j$ and the derived clock controlling the dummy latch node will be set to time $VO-DC_j$. The STA tool will determine whether or not the input signal will pass the dummy latch node in the timing abstraction model based on the valid time and the cycle count on the path from the input port.

The most critical path from the clock port to the output port O will have a delay $Delay_{jmax} = DO_{jmax} - DC_{jmax}$, where $DO_{jmax}$ is the signal arrival time at the output port O from the most critical clock port $C_{jmax}$ that determines the valid time according to equation (4).

The clock signal arrival times, $DO_j$ and the clock cycle counts, $Cycle_j$, can be obtained from any commercial STA tool, such as Pathmill. The clock signal arrival times and the clock cycle counts are stimulus independent because the clock signal propagation is independent on input signal arrival times.

The third characteristic to be extracted is an input-to-output delay, i.e., transparent delay arc. The delay exists only if, for some stimulus, the signal propagates transparently between the input port and the output port. The dummy latch node opens at the valid time and closes at the latest possible signal arrival time from an input port that has a timing path to the output port. Such time is determined by the required times and the path delays. Accordingly, the dummy latch node enables a signal to propagate from the input port to the output port only if the signal arrives at the output port later than a clock signal on the most critical clock controlling the dummy latch node. This feature is acceptable for STA tools because STA only deals with the most critical path, i.e., the most critical arrival at any given node.

Therefore, all inputs that arrive at the output port before the latest clock are blocked by the dummy latch node and will not propagate to the next block. The blocking of early arrived inputs simplifies output from the timing analysis because only the most relevant transparent paths are considered. More importantly, the timing abstraction model reduces the number of paths fed to the adjacent blocks and speeds-up the STA runs, because, by blocking the number of paths that leave the first block, the total number of paths in the circuit may be decreased significantly. In addition, by limiting timing analysis to the most critical paths, the timing abstraction model simplifies the output from the timing analysis and shortens designer's time to analyze STA results because only the paths that are important are printed in the report.

The input-to-output delays can be obtained from any commercial STA tool, such as Pathmill, when the input stimulus is set to the required time, SI, described above. These characteristics, i.e., the required time, the valid time, and the input-to-output delay, may be obtained from STA analysis as discussed above. Compared with Pathmill's Black box and Transparent Black box timing models, the timing abstraction model described above represents each input-to-output transparent path by an equivalent circuit that consists of time-arcs (or connectivity networks) and clock-controlled (dummy latch) nodes to model signal arrivals at the output ports independently on input stimulus. The equivalent circuit may be designed such that the tracing of false non-transparent paths is avoided and the reported transparent paths are limited to those critical paths that may be important for the designer. In other words, the timing abstraction model is input-stimulus independent and needs to be rebuilt only when the clock waveforms change.

FIG. 1 illustrates an exemplary circuit path, which focuses on one path of a circuit block. The exemplary circuit path has an input port 130, an output port 140, two latches 101, 102, and combinational logics 111, 112 in between the latches.

Figure 2:
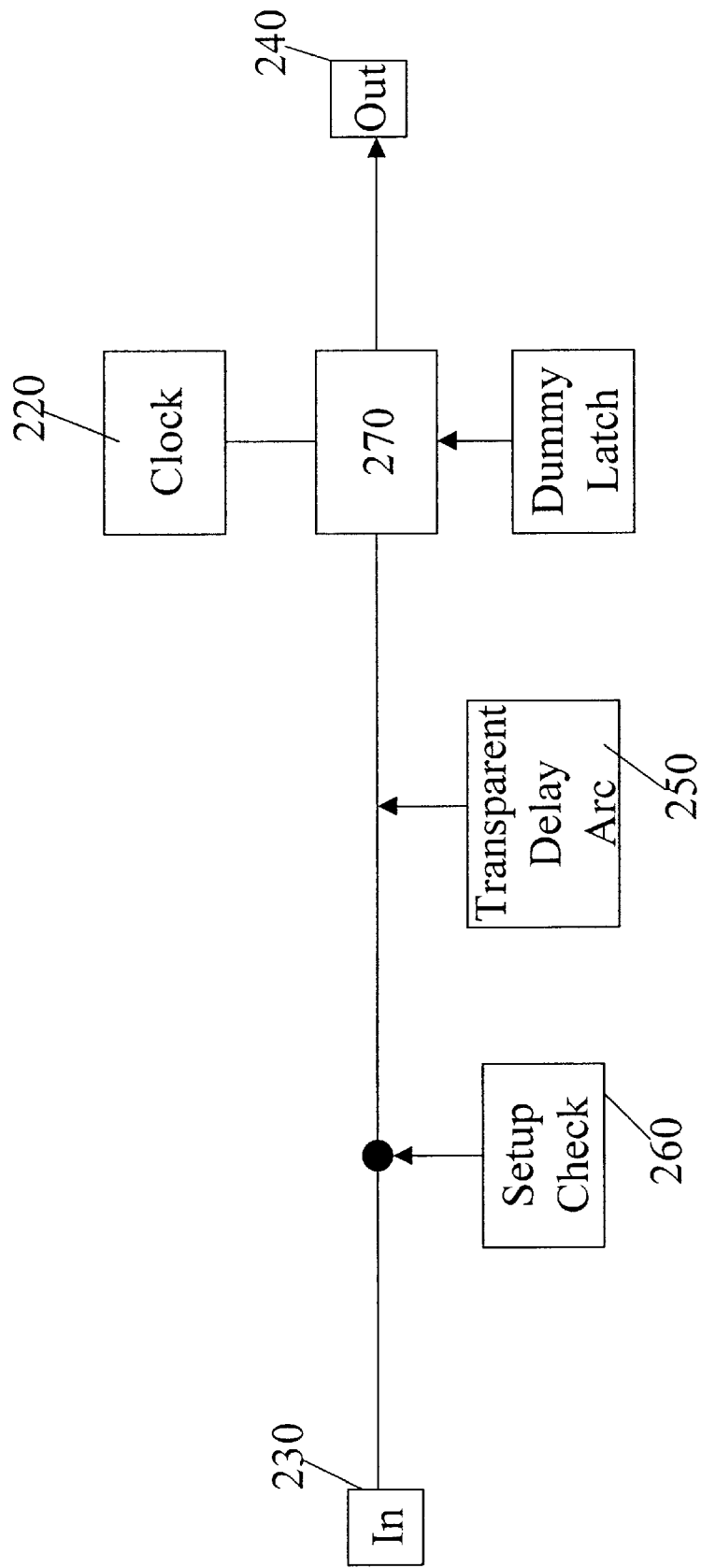
FIG. 2 illustrates an exemplary minimal level sensitive timing representative of the exemplary circuit path shown in FIG. 1.

FIG. 2 illustrates an exemplary minimal level sensitive timing representative of the exemplary circuit path shown in FIG. 1. The circuit path timing model includes a setup check node 260 at an input port 230, which corresponds to the input port 130 in the modeled circuit path, a transparent delay arc 250, and a dummy latch node 270 at an output port 240, which corresponds to the output port 140 in the modeled circuit path. The dummy latch node 270 is controlled by a derived clock 220, i.e., a dummy clock (Dclock), which has an opening edge and a closing edge, defining the opening edge of the dummy latch node 270.

The setup check node 260 at the first node of the circuit path typically provides the most strict setup check relative to the input port 230. Passing of the most strict check represents that setup checks for every latch on the input-to-output path will pass. The transparent delay arc 250 provides the time a signal transparently propagates from the input port 230 to the output port 240 through all the latches. Finally, the derived clock 220 is set to open at the time the latest clock-to-output signal arrives at the output port 240. For some circuits, it may not be possible for the signal to pass transparently through the entire path, and the transparent delay arc 250 may be removed.

For circuits that are clocked by more than one reference clock, in order to maintain the proper clock phase cycle counting when attaching the reduced path to other circuitry, it is necessary to have the first node's setup check calculated relative to the reference clock on the first latch in the path, because when the timing abstraction model is used by an STA tool, the closing edge of the first latch in the path of the actual circuit determines within which cycle the signal is received. Similarly, the dummy clock may be calculated relative to the reference clock triggering the last latch of the original path, because for the STA tool using the timing abstraction model, it is necessary to determine where in the cycle the signal is arriving. For example, if a clock rises at time T=0, and falls at time T=1 nanosecond, a signal triggered by a rising clock of the last latch of the block has a clock→out delay of 100 picoseconds, and the signal actually arrives at 100 picoseconds into the cycle. However, if the signal is triggered by a falling clock, the signal actually arrives at the output at 1.1 nanoseconds into the cycle. Therefore, the transparent delay arc may be needed and the number of cycles the path traveled through the block may need to be maintained.

Figure 3:
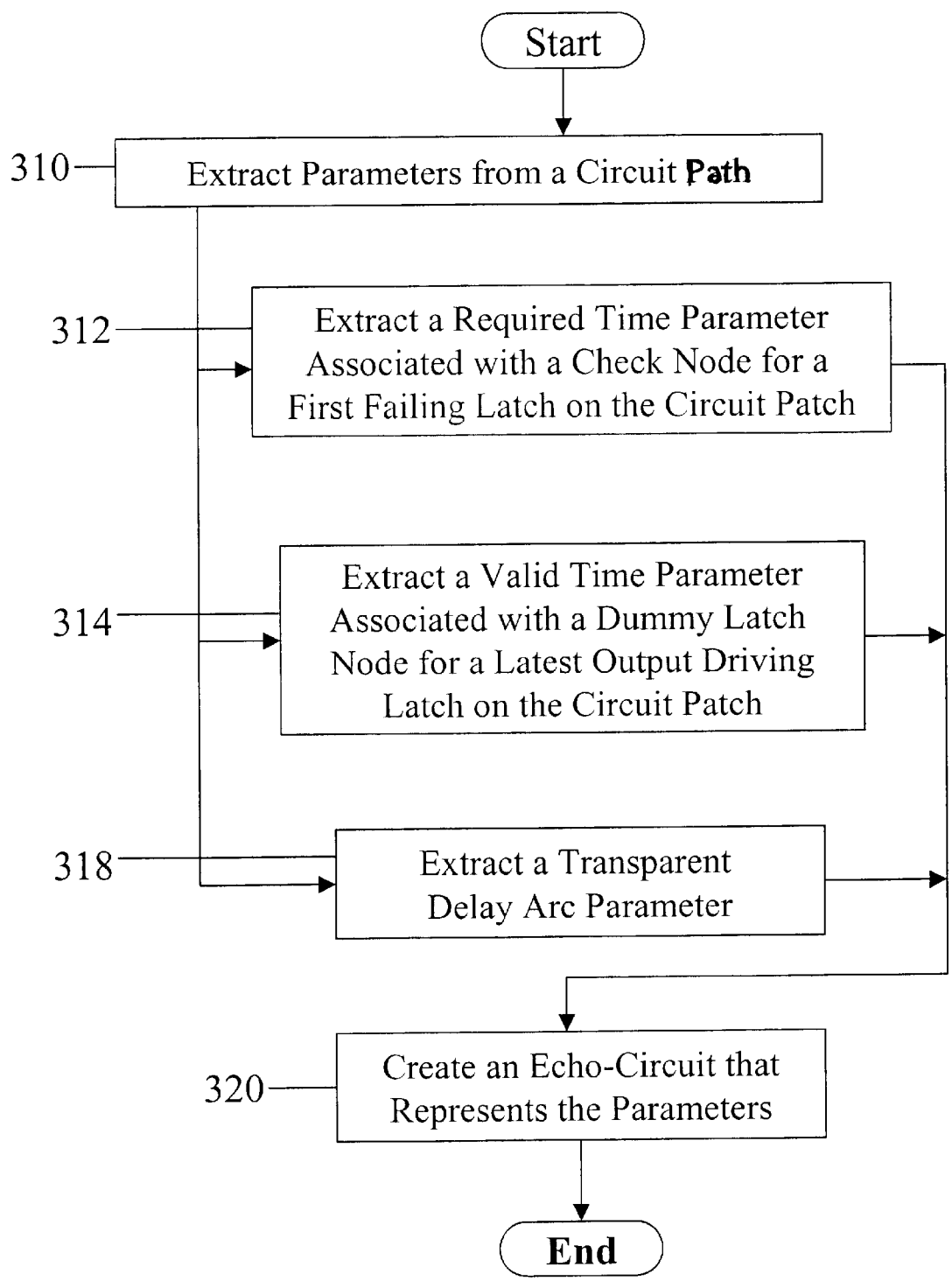
FIG. 3 is a flow chart illustrating an exemplary method for modeling a circuit path with a minimal level sensitive timing representative.

FIG. 3 is a flow chart illustrating an exemplary method for modeling a circuit path with a minimal level sensitive timing representative. First, parameters may be extracted from the circuit path that includes sequential elements, such as latches or domino logics, controlled by clock elements, step 310. The parameters to be extracted may include a required time parameter associated with a check node for a first failing latch on the circuit path, step 312, a valid time parameter associated with a dummy latch node for a latest output driving latch on the circuit path, step 314, or a transparent delay arc parameter, step 316. The calculation of the required time for the first failing latch on the circuit path is described above with respect to equations (1) and (2). The calculation of the valid time for the latest output driving latch on the circuit path is described above with respect to equations (4), (5), and (6). Finally, an echo-circuit, which maintains clock edges of a first latch at an input port and a last latch at an output port, may be created to represent the plurality of parameters, step 320. In the echo-circuit, the dummy latch node enables the signal to propagates from an input port to an output port only if the signal arrives at the output port later than a clock signal from the most critical clock element controlling the dummy latch node.

Figure 4:
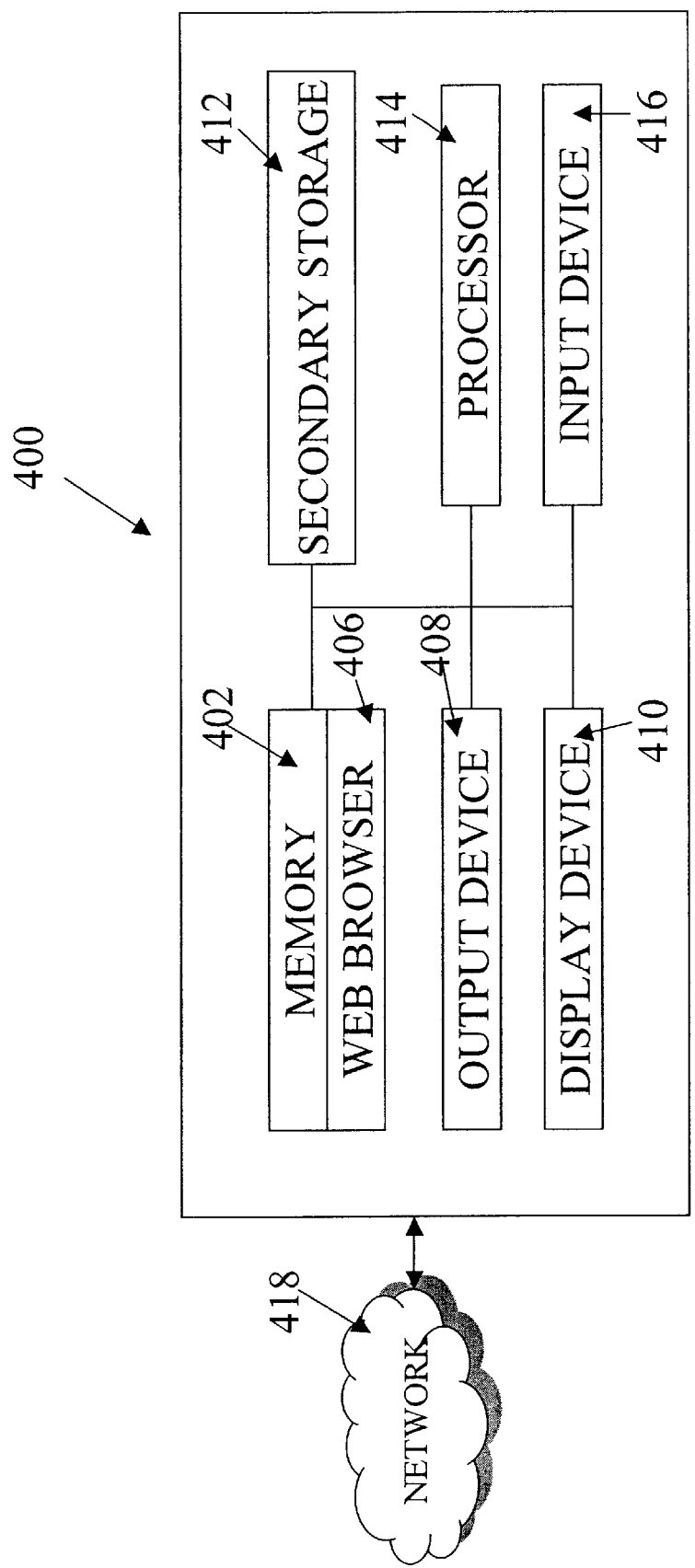
FIG. 4 illustrates exemplary hardware components of a computer that may be used to in connection with the minimal level sensitive timing representative of a circuit path.

FIG. 4 illustrates exemplary hardware components of a computer 400 that may be used to in connection with the minimal level sensitive timing representative of a circuit path. The computer 400 includes a connection with a network 418 such as the Internet or other type of computer or telephone networks. The computer 400 typically includes a memory 402, a secondary storage device 412, a processor 414, an input device 416, a display device 410, and an output device 408.

The memory 402 may include random access memory (RAM) or similar types of memory. The memory 402 may be connected to the network 418 by a web browser 406. The web browser 406 makes a connection by way of the world wide web (WWW) to other computers, and receives information from the other computers that is displayed on the computer 400. Information displayed on the computer 400 is typically organized into pages that are constructed using specialized language, such as HTML or XML. The secondary storage device 412 may include a hard disk drive, floppy disk drive, CD-ROM drive, or other types of non-volatile data storage, and may correspond with various databases or other resources. The processor 414 may execute information stored in the memory 402, the secondary storage 412, or received from the Internet or other network 418. The input device 416 may include any device for entering data into the computer 400, such as a keyboard, key pad, cursor-control device, touch-screen (possibly with a stylus), or microphone. The display device 410 may include any type of device for presenting visual image, such as, for example, a computer monitor, flat-screen display, or display panel. The output device 408 may include any type of device for presenting data in hard copy format, such as a printer, and other types of output devices include speakers or any device for providing data in audio form. The computer 400 can possibly include multiple input devices, output devices, and display devices.

Although the computer 400 is depicted with various components, one skilled in the art will appreciate that the computer 400 can contain additional or different components. In addition, although aspects of an implementation consistent with the present invention are described as being stored in memory, one skilled in the art will appreciate that these aspects can also be stored on or read from other types of computer program products or computer-readable media, such as secondary storage devices, including hard disks, floppy disks, or CD-ROM; a carrier wave from the Internet or other network; or other forms of RAM or ROM. The computer-readable media may include instructions for controlling the computer 400 to perform a particular method.

While the minimal level sensitive timing representative of a circuit path has been described in connection with an exemplary embodiment, those skilled in the art will understand that many modifications in light of these teachings are possible, and this application is intended to cover any variations thereof.

What is claimed is:

1. A method for modeling a circuit path with a minimal level sensitive timing representative, comprising:
   extracting a plurality of parameters from the circuit path that includes latches controlled by internally generated clock signals, wherein the extracting step comprises:
   extracting a required time parameter associated with a check node for a first failing latch on the circuit path;
   extracting a valid time parameter associated with a dummy latch node for a latest output-driving latch on the circuit path, wherein the valid time parameter traces a latest clock signal arriving at an output port, and wherein the dummy latch node is controlled by an internally generated clock signal that becomes active when the latest clock signal from the circuit path arrives at the output port; and
   creating an echo-circuit that represents the plurality of parameters and models the circuit path, wherein the echo-circuit is stimulus independent, port-based, has no internal latch nodes, and maintains clock edges of a first latch at an input port and a last latch at an output port, and wherein the dummy latch node enables a signal to propagate from an input port to an output port only if the signal arrives at the output port later than a latest clock signal from any pin clock signal controlling the dummy latch node.

2. The method of claim 1, wherein the extracting the plurality of parameters step includes extracting a required time parameter associated with a setup check node for the first failing latch on the circuit path.

3. The method of claim 1, wherein the extracting the plurality of parameters step includes extracting a required time parameter associated with a hold check node for the first failing latch on the circuit path.

4. The method of claim 1, wherein the extracting the plurality of parameters step includes extracting a transparent delay arc parameter that represents a time delay a signal passes from an input port to an output port of the circuit path.

5. The method of claim 1, further comprising calculating a transparent delay arc that represents a time delay a signal passes from an input port to an output port of the circuit path.

6. The method of claim 1, wherein the creating the echo-circuit step includes creating a circuit path timing abstraction model in Gray box format.

7. The method of claim 1, wherein the creating the echo-circuit step includes creating a circuit path timing model that is path-based.

8. The method of claim 1, wherein the creating the echo-circuit step includes creating a timing abstraction model that has level triggered latches.

9. The method of claim 1, wherein the creating the echo-circuit step includes creating a timing abstraction model that is stimulus independent.

10. A minimal level sensitive timing representative of a circuit path, comprising:

an input port that represent an input in the circuit path, wherein the circuit path includes latches controlled by internally generated clock signals;

an output port that represent an output in the circuit path;

a check node connected to the input port, wherein the check node calculates a required time for a first failing latch in the circuit path; and a dummy latch node connected to the output port, wherein the dummy latch node is controlled by an internally generated clock signal that becomes active when a latest clock signal from the circuit path arrives at the output port, wherein the dummy latch node calculates a valid time for a latest output driving latch in the circuit path, and wherein the valid time traces the latest clock signal arriving at the output port, wherein the dummy latch node enables a signal to propagate from the input port to the output port only if the signal arrives at the output port later than a latest clock signal from any pin clock signal controlling the dummy latch node, and wherein the time representative models the circuit path and is stimulus independent, port-based, and has no internal latch nodes.

11. The minimal level sensitive timing representative of claim 10, wherein the check node is a setup check node.

12. The minimal level sensitive timing representative of claim 10, wherein the check node is a hold check node.

13. The minimal level sensitive timing representative of claim 10, further comprising a transparent delay arc that represents a time delay a signal passes from the input port to the output port of the circuit path.

14. The minimal level sensitive timing representative of claim 10, wherein the latches are level triggered latches.

15. A computer readable medium providing instructions for modeling a circuit path with a minimal level sensitive timing representative, the instructions comprising:

extracting a plurality of parameters from the circuit path that includes latches controlled by internally generated clock signals, wherein the extracting step comprises:

extracting a required time parameter associated with a check node for a first failing latch on the circuit path;

extracting a valid time parameter associated with a dummy latch node for a latest output driving latch on the circuit path, wherein the valid time parameter traces a latest clock signal arriving at an output port, and wherein the dummy latch node is controlled by an internally generated clock signal that becomes active when the latest clock signal from the circuit path arrives at the output port; and creating an echo-circuit that represents the plurality of parameters and models the circuit path, wherein the echo-circuit is stimulus independent, port-based, has no internal latch nodes, and maintains clock edges of a first latch at an input port and a last latch at an output port, and wherein the dummy latch node enables a signal to propagate from an input port to an output port only if the signal arrives at the output port later than a latest clock signal from any pin clock signal controlling the dummy latch node.

16. The computer readable medium of claim 15, wherein the instructions for extracting the plurality of parameters step includes instructions for extracting a required time parameter associated with a setup check node for the first failing latch on the circuit path.

17. The computer readable medium of claim 15, wherein the instructions for extracting the plurality of parameters step includes instructions for extracting a required time parameter associated with a hold check node for the first failing latch on the circuit path.

18. The computer readable medium of claim 15, wherein the instructions for extracting the plurality of parameters step includes instructions for extracting a transparent delay arc parameter that represents a time delay a signal passes from an input port to an output port of the circuit path.

19. The computer readable medium of claim 15, wherein the instructions for creating the echo-circuit step includes instructions for creating a circuit path timing model that is path-based.

20. The computer readable medium of claim 15, wherein the instructions for creating the echo-circuit step includes instructions for creating a timing abstraction model that is stimulus independent.

* * * * *